United States Patent
Shen

(10) Patent No.: US 9,881,945 B2
(45) Date of Patent: Jan. 30, 2018

(54) METHODS OF MANUFACTURING THIN FILM TRANSISTOR AND ARRAY SUBSTRATE

(71) Applicants: BOE Technology Group Co., Ltd., Beijing (CN); Hefei BOE Optoelectronics Technology Co., Ltd., Anhui (CN)

(72) Inventor: Qiyu Shen, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/307,827

(22) PCT Filed: Dec. 23, 2015

(86) PCT No.: PCT/CN2015/098441
§ 371 (c)(1),
(2) Date: Oct. 30, 2016

(87) PCT Pub. No.: WO2017/024718
PCT Pub. Date: Feb. 16, 2017

(65) Prior Publication Data
US 2017/0186785 A1    Jun. 29, 2017

(30) Foreign Application Priority Data

Aug. 13, 2015 (CN) .......................... 2015 1 0498376

(51) Int. Cl.
*H01L 27/12* (2006.01)
*H01L 21/027* (2006.01)
(Continued)

(52) U.S. Cl.
CPC ...... *H01L 27/1288* (2013.01); *H01L 21/0274* (2013.01); *H01L 21/465* (2013.01);
(Continued)

(58) Field of Classification Search
CPC combination set(s) only.
See application file for complete search history.

(56) References Cited

U.S. PATENT DOCUMENTS 6,847,048 B2   1/2005   Yan et al.
7,649,581 B2   1/2010   Choi et al.
(Continued)

FOREIGN PATENT DOCUMENTS

CN   1409417 A   4/2003
CN   1727976 A   2/2006
(Continued)

OTHER PUBLICATIONS

International Search Report and Written Opinion, including English translation of Box No. V of the Written Opinion, for International Application No. PCT/CN2015/098441, dated Apr. 13, 2016, 12 pages.

(Continued)

*Primary Examiner* — Mamadou Diallo
(74) *Attorney, Agent, or Firm* — Westman, Champlin & Koehler, P.A.

(57) ABSTRACT

A method of manufacturing a thin film transistor is disclosed. The method of manufacturing the thin film transistor includes: manufacturing a substrate; forming an oxide semiconductor layer on the substrate; forming a pattern including an active layer through a patterning process; forming a source and drain metal layer on the active layer; and forming a pattern including a source electrode and a drain electrode through a patterning process, an opening being formed between the source electrode and the drain electrode at a (Continued)

position corresponding to a region of the active layer used as a channel, wherein the step of forming the pattern including the source electrode and the drain electrode through a patterning process includes: removing a portion of the source and drain metal layer corresponding to the position of the opening through dry etching. The method may also be used to manufacturing a thin film transistor.

14 Claims, 3 Drawing Sheets

(51) Int. Cl.
*H01L 29/66* (2006.01)
*H01L 21/465* (2006.01)
*H01L 21/77* (2017.01)

(52) U.S. Cl.
CPC .......... *H01L 27/124* (2013.01); *H01L 27/127* (2013.01); *H01L 27/1225* (2013.01); *H01L 29/66969* (2013.01); *H01L 2021/775* (2013.01)

(56) References Cited

U.S. PATENT DOCUMENTS

| | | | |
|---|---|---|---|
| 8,017,465 B2 | 9/2011 | Choi et al. | |
| 9,171,941 B2 | 10/2015 | Yoo et al. | |
| 9,379,148 B2 | 6/2016 | Sung et al. | |
| 9,698,171 B2 | 7/2017 | Sung et al. | |
| 2008/0318368 A1 | 12/2008 | Ryu et al. | |
| 2011/0068341 A1* | 3/2011 | Li | H01L 27/12 257/59 |
| 2012/0127389 A1* | 5/2012 | Nagami | G02F 1/134309 349/47 |
| 2014/0080254 A1* | 3/2014 | Yoo | H01L 29/7869 438/104 |
| 2015/0187809 A1* | 7/2015 | Kim | H01L 27/124 438/104 |
| 2015/0279674 A1* | 10/2015 | Cho | H01L 21/02631 257/43 |
| 2016/0133729 A1* | 5/2016 | Xu | H01L 29/45 438/104 |
| 2016/0377895 A1* | 12/2016 | Liu | H01L 21/77 257/43 |

FOREIGN PATENT DOCUMENTS

| | | |
|---|---|---|
| CN | 101685229 A | 3/2010 |
| CN | 102881598 A | 1/2013 |
| CN | 103579104 A | 2/2014 |
| CN | 103855087 A | 6/2014 |
| CN | 103915452 A | 7/2014 |
| CN | 104714347 A | 6/2015 |
| CN | 105097551 A | 11/2015 |

OTHER PUBLICATIONS

First Office Action from Chinese Patent Application No. 201510498376.4, dated Jul. 25, 2017, 11 pages.

* cited by examiner

METHODS OF MANUFACTURING THIN FILM TRANSISTOR AND ARRAY SUBSTRATE

CROSS-REFERENCE TO RELATED APPLICATIONS

This application is a Section 371 National Stage Application of International Application No. PCT/CN2015/098441, filed 23 Dec. 2015, entitled "METHODS OF MANUFACTURING THIN FILM TRANSISTOR AND ARRAY SUBSTRATE", which has not yet published, which claims priority to Chinese Application No. 201510498376.4, filed on 13 Aug. 2015, incorporated herein by reference in their entirety.

TECHNICAL FIELD

The present invention relates to field of display technologies, and specially, to a method of manufacturing a thin film transistor and a method of manufacturing an array substrate.

BACKGROUND

Currently, commonly used liquid crystal displays are thin film transistor liquid crystal displays. Thin film transistors may be classified into amorphous silicon thin film transistors, polycrystalline silicon thin film transistors, and oxide semiconductor thin film transistors based on materials of active layers. Oxide semiconductor thin film transistors have been widely used in liquid crystal displays due to their advantages such as simple manufacturing process, high electron mobility and the like.

Currently, a process of manufacturing an oxide semiconductor thin film transistor may include: a first step of forming a gate metal layer and forming a pattern including a gate electrode through a patterning process; a second step of forming a gate insulation layer on the gate electrode; a third step of forming an oxide semiconductor layer and forming a pattering including an active layer through a patterning process; and a fourth step of forming a source and drain metal layer on the active layer and forming a pattern including a source electrode and a drain electrode through a patterning process.

In the fourth step, an acidic etching solution needs to be used to etch the source and drain metal layer so as to form the pattern including the source electrode and the drain electrode, therefore, in the etching process, a region of the active layer being used as a channel is directly exposed to the acidic etching solution, thereby this region may be corroded by the acidic etching solution, and in turn, electrical properties of the oxide semiconductor thin film transistor may be adversely affected.

To solve this problem, there is a solution, where an etching stop layer is formed on the active layer, then a source and drain metal layer is formed, then the source and drain metal layer is subjected to a wet etching to form a source electrode and a drain electrode. In this manner, the problem of the region of the active layer used as a channel being corroded during forming the source electrode and the drain electrode through etching may be solved. In this solution, however, the source electrode and the drain electrode need to be connected to the active layer though via-holes formed in the etching stop layer. Due to restriction from process of forming the via-holes, a distance between a source electrode and a drain electrode is relatively large in prior art, such that the channel has a relatively large length, which is disadvantageous to improve electrical properties of the oxide semiconductor thin film transistor, and the oxide semiconductor thin film transistor may have relatively large sizes, which is disadvantageous for improving aperture ratio and resolution of a display device.

Therefore, there needs a manufacturing method which may prevent an active layer from being corroded and will not degrade electrical properties of an oxide semiconductor thin film transistor.

SUMMARY

An object of the present invention is to provide a method of manufacturing a thin film transistor, and a method of manufacturing an array substrate, which may prevent a region of the active layer that is used as a channel from being corroded during forming the source electrode and the drain electrode by etching.

In order to achieve the above object, according one aspect of the invention, there is provided a method of manufacturing a thin film transistor.

In an exemplary embodiment, the method of manufacturing a thin film transistor includes the following steps of: manufacturing a substrate; forming an oxide semiconductor layer on the substrate; forming a pattern including an active layer through a patterning process; forming a source and drain metal layer on the active layer; and forming a pattern including a source electrode and a drain electrode through a patterning process, the pattern further including an opening formed between the source electrode and the drain electrode at a position corresponding to a region of the active layer used as a channel, wherein the step of forming the pattern including the source electrode and the drain electrode through a patterning process includes: removing a portion of the source and drain metal layer corresponding to the position of the opening through dry etching.

In the method of manufacturing thin film transistor according to the embodiment of the invention, a portion of the source and drain metal layer corresponding to the position where the opening is located, i.e., a portion of the source and drain metal layer corresponding to the region of the active layer used as the channel, is removed through dry etching, such that no acidic etching solution is needed in the etching process, so that the region of the active layer used as the channel may be protected from being corroded by acidic etching solution during the process of forming the source electrode and the drain electrode by etching, and in turn, electrical properties of the oxide semiconductor thin film transistor may be effectively improved.

Additionally, there is also provided a method of manufacturing an array substrate, which includes the method of manufacturing the thin film transistor.

Since the method of manufacturing the array substrate according to the embodiment of the invention includes the method of manufacturing the thin film transistor, the method of manufacturing an array substrate has the same beneficial effects as the method of manufacturing the thin film transistor, which will not be repeated herein.

BRIEF DESCRIPTION OF THE DRAWINGS

To clearly illustrate technical solutions according to embodiments of the invention or prior art, a brief description of the following drawing that are used for describing the embodiments will be introduced. Apparently, the illustrated drawings only present some of embodiments of the inven

LIST OF REFERENCE NUMERALS

Figure 1:
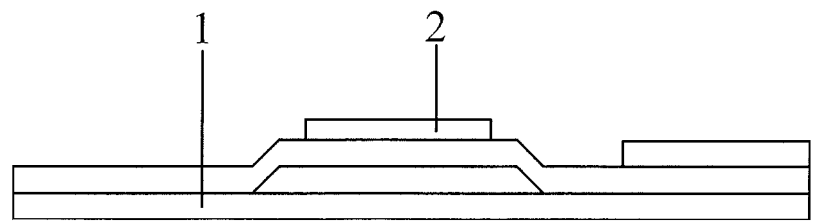
- FIG. 1 is a schematic drawing showing a substrate formed thereon with a pattern including an active layer according to an embodiment of the invention.

1—base substrate;
2—active layer;
3—source and drain metal layer;
4—first region;
5—second region;
6—third region;
7—source electrode;
8—drain electrode;
9—opening;
10—gate electrode;
11—gate insulation layer;
12—first pixel electrode;
13—passivation layer; and
14—second pixel electrode.

DETAILED DESCRIPTION OF PREFERRED EMBODIMENTS

Technical solutions in embodiments of the invention will be described clearly and completely in conjunction with the appended drawings showings the embodiments. Apparently, the described embodiments are just a portion, not all, of possible implements of the invention. All other embodiments that can be obtained by those ordinary skilled in the art based on the embodiments described in this disclosure without a creative work shall fall within the scope of the invention.

First Embodiment

This embodiment of the invention provides a method of manufacturing a thin film transistor, which includes steps of:
Manufacturing a substrate;
forming an oxide semiconductor layer on the substrate;
forming a pattern including an active layer through a patterning process;
forming a source and drain metal layer on the active layer; and
forming a pattern including a source electrode and a drain electrode through a patterning process, the pattern further including an opening formed between the source electrode and the drain electrode at a position corresponding to a region of the active layer used as a channel.

The step of forming the pattern including a source electrode and a drain electrode through a patterning process includes: removing a portion of the source and drain metal layer corresponding to a position where the opening is located through dry etching.

In the method of manufacturing thin film transistor according to the embodiment of the invention, a portion of the source and drain metal layer corresponding to the position where the opening is located, i.e., a portion of the source and drain metal layer corresponding to the region of the active layer used as the channel, is removed through dry etching, such that no acidic etching solution is needed in the etching process, so that the region of the active layer used as the channel may be protected from being corroded by acidic etching solution during the process of forming the source electrode and the drain electrode by etching, and in turn, electrical properties of the oxide semiconductor thin film transistor may be effectively improved.

Compared with prior art, in the embodiment of the invention, a dry etching process is used to remove the portion of the source and drain metal layer at the position where the opening is to be formed, such that no etching stop layer is needed, and in turn, the opening between the source electrode and the drain electrode may be relatively small, a length of the channel may be relatively small, electrical properties of the oxide semiconductor thin film transistor may be ensured, and the oxide semiconductor thin film transistor may have relatively small sizes, which are advantageous for improving aperture ratio and resolution of a display device.

Exemplarily, after the oxide semiconductor layer is formed, a portion of a structure of the thin film transistor that has been completed is shown in FIG. 1. Manufacturing steps before forming the oxide semiconductor layer are the same as those in prior art and will not be described in detail. Additionally, the substrate described in embodiments of the invention is a combination of a base substrate 1 and a gate metal layer and a gate insulation layer that are formed on the base substrate 1, i.e., the substrate includes the base substrate 1 and the gate metal layer and the gate insulation layer that are formed on the base substrate 1.

Referring to FIG. 1, the step of forming the oxide semiconductor layer according to the embodiment of the invention is described in detail as follows:

first, an oxide semiconductor layer is deposited on the substrate through plasma-enhanced physical vapor deposition; for example, a thickness of the oxide semiconductor layer may range from 30 nm to 80 nm, and a material of the oxide semiconductor layer may be indium gallium zinc oxide;

then, a layer of photoresist is coated on the oxide semiconductor layer, and the photoresist is shielded, exposed and developed by means of a mask, so as to pattern the photoresist;

next, a portion of the oxide semiconductor layer that is not covered by photoresist is removed through wet etching and the photoresist is peeled off, so that a pattern including an active layer 2 is formed. For example, during the wet etching, the portion of the oxide semiconductor layer that is not covered by the photoresist may be removed by an acidic etching solution, and the acidic etching solution may be an acid having a strong corrosiveness, such as hydrochloric acid, sulphuric acid or the like.

Figure 2:
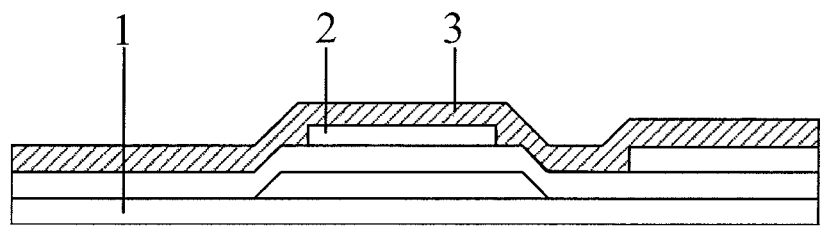
FIG. 2 is a schematic drawing showing the substrate formed thereon with a source and drain metal layer according to an embodiment of the invention.
Figure 3:
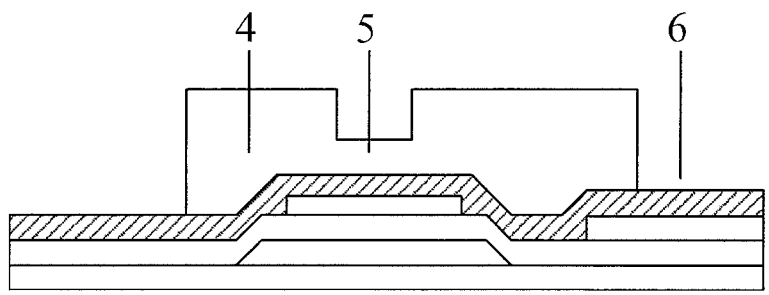
FIG. 3 is a schematic drawing showing the substrate formed thereon with a totally remaining region, a partially remaining region and a totally removing region according to an embodiment of the invention.

Exemplarily, in the step of forming the source and drain metal layer, the source and drain metal layer may be formed through plasma physical vapor deposition on the substrate on which the active layer 2 has been formed. For example, a material of the source and drain metal layer may be metal such as copper, molybdenum or the like having a low electrical resistance such that a dry etching process may be performed. After the source and drain metal layer is formed, a structure is shown in FIG. 2. For example, the source and drain metal layer 3 covers the entire substrate.

Figure 4:
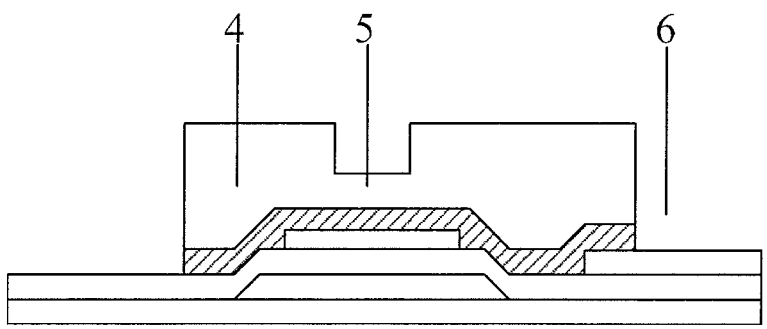
FIG. 4 is a schematic drawing showing the substrate with a portion of the source and drain metal layer within the totally removing region being removed according to an embodiment of the invention.

Further, before removing a portion of the source and drain metal layer at the position of the opening through dry etching, the step of forming the pattern including the source electrode and the drain electrode through a patterning process may include:

coating a layer of photoresist on the source and drain metal layer;

shielding and exposing the photoresist with a mask to form a first region where photoresist is totally unexposed, a second region where photoresist is partially exposed, and a third region where photoresist is totally exposed, wherein the first region 4 corresponds to positions of the source electrode and the drain electrode, the second region 5 corresponds to the position of the opening, and the third region 6 corresponds to other positions;

developing the exposed photoresist, such that photoresist in the first region is totally remained, photoresist in the second region is partially remained, and photoresist in the third region is totally removed;

removing a portion of the source and drain metal layer within the third region through a wet etching process (a structure obtained after the wet etching process is shown in FIG. 4, the third region 6 is not covered by the source and drain metal layer 3, and because of shielding of the photoresist, portions of the source and drain metal layer 3 located at positions corresponding to the second region 5 and the first region 4 are still remained); and removing the photoresist within the second region through an ashing process, so as to expose a portion of the source and drain metal layer at a position where the opening is to be formed.

Figure 5:
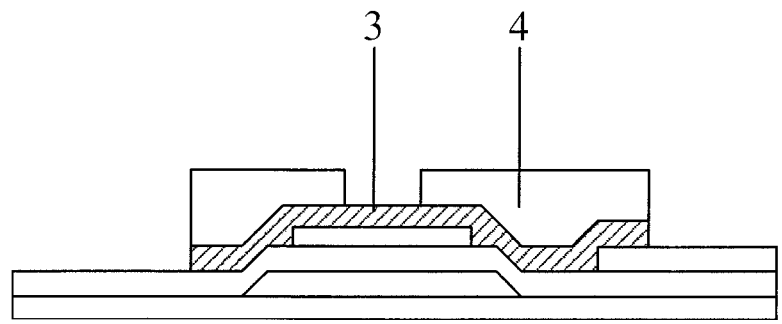
FIG. 5 is a schematic drawing showing the substrate with photoresist within the partially remaining region being removed according to an embodiment of the invention.
Figure 6:
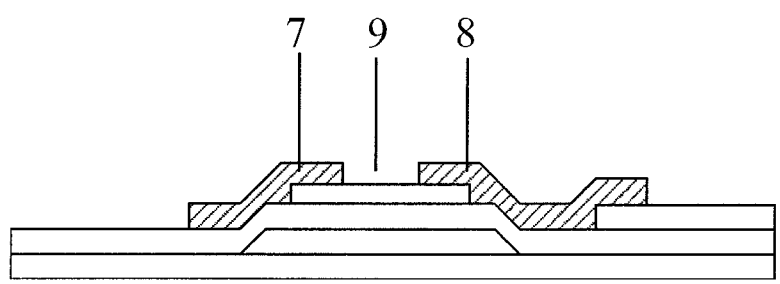
FIG. 6 is a schematic drawing showing the substrate formed thereon with a pattern including a source electrode and a drain electrode according to an embodiment of the invention.

As shown in FIG. 5, after the ashing process, the photoresist in the second region 5 is removed, such that the portion of the source and drain metal layer 3 at the position of the opening between the source electrode and the drain electrode is exposed, and at the same time, the photoresist in the first region 4 is thinned, then the portion of the source and drain metal layer 3 at the position of the opening may be removed through a subsequent dry etching process. However, a portion of the source and drain metal layer 3 within the first region 4 is still remained due to shielding of the photoresist, and a source electrode 7 and a drain electrode 8 shown in FIG. 6 are formed, and the opening 9 is located between the source electrode 7 and the drain electrode 8.

Additionally, the mask used in shielding and exposing process performed on the photoresist may be: a single slit mask, a semi-transparent mask, or a gray tone mask.

Additionally, a method of manufacturing the substrate may include the following steps of:

providing a base substrate;

forming a gate metal layer on the base substrate;

forming a pattern including a gate electrode through a patterning process; and forming a gate insulation layer on the gate electrode.

Figure 7:
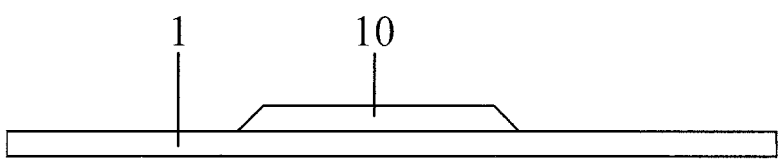
FIG. 7 is a schematic drawing showing the substrate formed thereon with a pattern including a gate electrode according to an embodiment of the invention.

Exemplarily, after the pattern including the gate electrode is formed, a portion of the thin film transistor that has been manufactured is shown in FIG. 7. According to the embodiment of the invention, steps of forming the gate metal layer on the base substrate and forming the pattern including the gate electrode through patterning process will be described in detail as follows in conjunction with FIG. 7.

First, the gate metal layer is deposited on the base substrate through plasma physical vapor deposition. For example, the gate metal layer may have a monolayer structure formed from a metal material having a low electrical resistance, such as aluminum, molybdenum, copper or the like, or it may have a multilayer structure formed from aluminum/molybdenum, molybdenum/aluminum/molybdenum, or the like.

Then, a layer of photoresist is coated on the gate metal layer that has been formed, and the photoresist is masked by a mask, and the photoresist is exposed and developed to pattern the photoresist.

Then, a portion of the gate metal layer that is not covered by photoresist is removed through a wet etching process, and the photoresist is peeled off, so that the pattern including the gate electrode 10 is formed. For example, during the wet etching process, an acidic etching solution may be used to remove the portion of the gate metal layer that is not covered by photoresist, and the acidic etching solution may be an acid having a strong corrosiveness, such as hydrochloric acid, sulphuric acid or the like.

Figure 8:
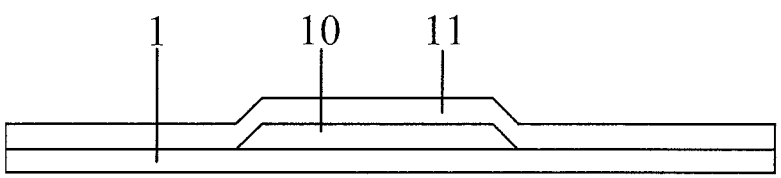
FIG. 8 is a schematic drawing showing the substrate formed thereon with a gate insulation layer according to an embodiment of the invention.

Exemplarily, after the gate insulation layer is formed, a portion of the thin film transistor that has been manufactured is shown in FIG. 8. Referring to FIG. 8, the step of forming the gate insulation layer is specifically described as follows: a gate insulation layer 11 is deposited over the base substrate through plasma-enhanced chemical vapor deposition process. A material of the gate insulation layer 11 may be, for example, silicon nitride, silicon dioxide, or an organic insulation material having a high electrical resistance.

In order to make it convenient for those skilled in the art to understand the concept of the invention, an embodiment of the invention provides a specific method of manufacturing a thin film transistor, which includes the following steps of:

providing the base substrate, forming the gate metal layer on the base substrate, and forming the pattern including the gate electrode through a patterning process, as shown in FIG. 7; and forming the gate insulation layer 11 on the gate electrode 10, as shown in FIG. 8;

forming the oxide semiconductor layer on the gate insulation layer 11, and forming the pattern including the active layer 2 through a patterning process, as shown in FIG. 1;

forming the source and drain metal layer 3 on the active layer 2, as shown in FIG. 2; and forming the pattern including the source electrode 7 and the drain electrode 8 through a patterning process, as shown in FIGS. 3-6.

Second Embodiment

This embodiment of the invention provides a method of manufacturing an array substrate, which includes the method of manufacturing the thin film transistor according to the first embodiment Since the method of manufacturing an array substrate according to the embodiment of the invention includes the method of manufacturing the thin film transistor according to the first embodiment, the method of manufacturing an array substrate has the same beneficial effects as the method of manufacturing the thin film transistor, which will not be repeated herein.

Figure 9:
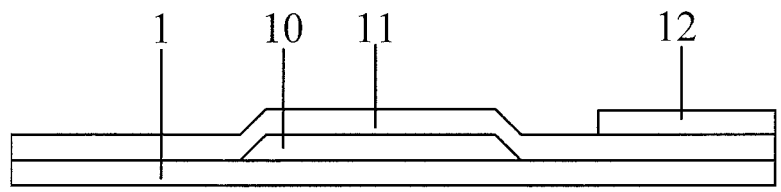
FIG. 9 is a schematic drawing showing the substrate formed thereon with a first pixel electrode according to an embodiment of the invention.

Further, before the steps of forming the source and drain metal layer and forming the pattern including the source electrode and the drain electrode, the method of manufacturing an array substrate also includes:

forming a first pixel electrode such that a position of a portion of the first pixel electrode corresponds to a position where a portion of the drain electrode of the thin film transistor will be formed later, as shown in FIG. 9; and annealing the first pixel electrode.

Exemplarily, the step of forming the first pixel electrode is specifically described as follows.

First, a transparent electrically conductive layer is deposited on the substrate through a plasma physical vapor deposition process.

Then, a layer of photoresist is coated on the transparent electrically conductive layer, and the photoresist is shielded by a mask and exposed and developed through the mask, so that the photoresist is patterned.

Then, a portion of the transparent electrically conductive layer that is not covered by photoresist is removed through a wet etching process, and the photoresist is peeled off, so that a pattern including a first pixel electrode 12 is formed. For example, a material of the transparent electrically conductive layer may be tin indium oxide, zinc oxide or the like. During the wet etching process, an acidic etching solution may be used to remove the portion of the transparent electrically conductive layer that is not covered by photoresist, and the acidic etching solution may be an acid having a strong corrosiveness, such as hydrochloric acid, sulphuric acid or the like. Optionally, the first pixel electrode 12 may be a plate-shaped electrode.

During annealing the first pixel electrode 12, for example, an atmosphere for the annealing may be air (such as, ultrapure clean air) or nitrogen gas, a temperature for the annealing may range from 230° C. to 280° C., and a time period for the annealing may range from 20 minutes to 40 minutes. After the annealing, the material of the transparent electrically conductive layer may be recrystallized, such that crystal defects in the first pixel electrode 12 may be reduced such that the first pixel electrode may not be corroded easily by the acidic etching solution used in subsequent processes of etching oxide semiconductor layer and the source and drain metal layer, and the electrical properties can be improved.

Figure 10:
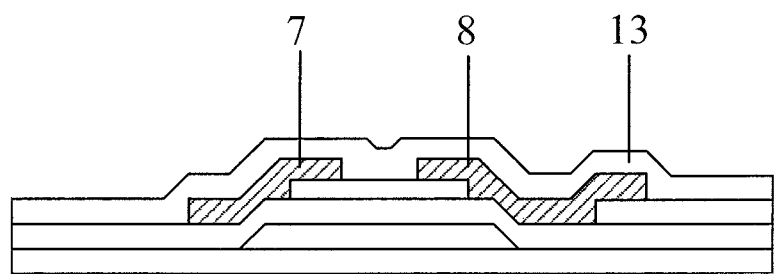
FIG. 10 is a schematic drawing showing the substrate formed thereon with a passivation layer according to an embodiment of the invention.
Figure 11:
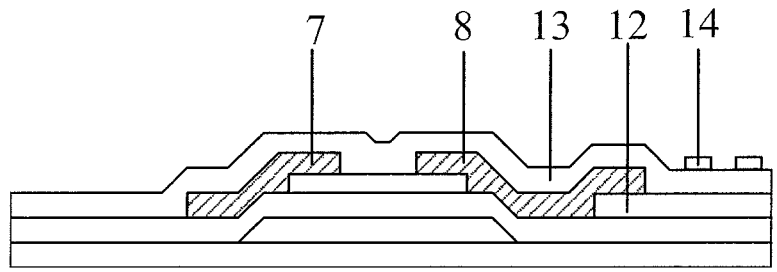
FIG. 11 is a schematic drawing showing the substrate formed thereon with a second pixel electrode according to an embodiment of the invention.

Further, after the step of forming the pattern including the source electrode 7 and the drain electrode 8 through a patterning process, the method of manufacturing the array substrate further includes the following steps of:

forming a passivation layer 13 over the source electrode and the drain electrode, as shown in FIG. 10;

forming a second pixel electrode on the passivation layer, as shown in FIG. 11; and annealing the second pixel electrode.

Exemplarily, the step of forming the passivation layer may be achieved by depositing the passivation layer 13 on the substrate through plasma-enhanced chemical vapor deposition. A material of the passivation layer 13 may be: silicon dioxide, silicon nitride, or a composite of silicon dioxide and silicon nitride.

Further, after the step of forming the passivation layer 13, the embodiment of the invention also includes annealing parts of the array substrate that have been formed to recrystallize the oxide semiconductor, such that electrical consistency of the active layer 2 may be improved. Exemplarily, during the annealing, a temperature for the annealing may be 280° C., and a time period for the annealing may range from 20 minutes to 40 minutes.

Exemplarily, the step of forming the second pixel electrode may be realized in the following manner. First, a transparent electrically conductive layer is deposited on the substrate through a plasma physical vapor deposition process. Then, a layer of photoresist is coated on the transparent electrically conductive layer, and the photoresist is shielded by a mask and exposed and developed through the mask, so that the photoresist is patterned. Then, a portion of the transparent electrically conductive layer that is not covered by photoresist is removed through a wet etching process, and the photoresist is peeled off, so that a pattern including a second pixel electrode 14 is formed. A material of the transparent electrically conductive layer may be tin indium oxide, zinc oxide or the like. During the wet etching process, an acidic etching solution may be used to remove the portion of the transparent electrically conductive layer that is not covered by photoresist, and the acidic etching solution may be an acid having a strong corrosiveness, such as hydrochloric acid, sulphuric acid or the like. Optionally, the second pixel electrode 14 may be a slit electrode or a strip-shaped electrode.

In an embodiment of the invention, preferably, the first pixel electrode 12 is a plate-shaped electrode and the second pixel electrode 14 is a slit electrode or a strip-shaped electrode, such that a multi-dimensional electric field is formed between the first pixel electrode 12 and the second pixel electrode 14, and such that liquid crystal molecules located between and above the second pixel electrodes can be deflected, so as to improve operation efficiency of the liquid crystal molecules and increase light transmittance.

During annealing the second pixel electrode 14, an atmosphere for the annealing may be air (such as, ultrapure clean air) or nitrogen gas, a temperature for the annealing may range from 230° C. to 280° C., and a time period for the annealing may range from 20 minutes to 40 minutes. After the annealing, the material of the transparent electrically conductive layer may be recrystallized, such that crystal defects in the second pixel electrode 14 may be reduced, and the second pixel electrode may not be corroded easily and the electrical properties can be improved.

In order to make it convenient for those skilled in the art to understand the concept of the invention, an embodiment of the invention provides a specific method of manufacturing an array substrate, which includes the following steps of:

providing the base substrate, forming the gate metal layer on the base substrate, and forming the pattern including the gate electrode through a patterning process, as shown in FIG. 7; and forming the gate insulation layer 11 on the gate electrode 10, as shown in FIG. 8;

forming the first pixel electrode 12 on the gate insulation layer 11, as shown in FIG. 9;

annealing the first pixel electrode 12;

forming the oxide semiconductor layer on the gate insulation layer 11, and forming the pattern including the active layer 2 through a patterning process, as shown in FIG. 1;

forming the source and drain metal layer 3 on the active layer 2, as shown in FIG. 2;

forming the pattern including the source electrode 7 and the drain electrode 8 through a patterning process, as shown in FIGS. 3-6;

forming the passivation layer 13 over the source electrode 7 and the drain electrode 8, as shown in FIG. 10;

annealing the parts of the array substrate that have been formed;

forming the second pixel electrode 14 on the passivation layer 13, as shown in FIG. 11; and annealing the second pixel electrode 14.

Scope of the invention is not limited to the description above, which only discloses specific embodiments of the invention. All changes or replacements that are apparent to those skilled in the art based on the above disclosed technical contents shall fall within the scope of the invention. Thus, scope of the invention should be defined by the appended claims.

What is claimed is:

1. A method of manufacturing a thin film transistor, comprising:

manufacturing a substrate;

forming an oxide semiconductor layer on the substrate;

forming a pattern including an active layer through a patterning process;

forming a source and drain metal layer on the active layer; and forming a pattern including a source electrode and a drain electrode through a patterning process, an opening being formed between the source electrode and the drain electrode at a position corresponding to a region of the active layer used as a channel, wherein forming the pattern including the source electrode and the drain electrode through a patterning process includes:

coating a layer of photoresist on the source and drain metal layer;

shielding and exposing the photoresist with a mask to form a first region where photoresist is totally unexposed, a second region where photoresist is partially exposed, and a third region where photoresist is totally exposed, wherein the first region corresponds to positions of the source electrode and the drain electrode, the second region corresponds to the position of the opening, and the third region corresponds to other positions;

developing the exposed photoresist, such that photoresist in the first region is totally remained, the photoresist in the second region is partially remained, and photoresist in the third region is totally removed;

removing a portion of the source and drain metal layer at a position corresponding to the third region through a wet etching process;

removing the photoresist within the second region through an ashing process, so as to expose a portion of the source and drain metal layer at a position of the opening; and removing the portion of the source and drain metal layer corresponding to the position of the opening completely through dry etching such that a portion of the active layer is exposed.

2. The method according to claim 1, wherein the mask is a single slit mask, a semi-transparent mask or a gray tone mask.

3. A method of manufacturing an array substrate, comprising:

forming a thin film transistor through the method according to claim 2.

4. The method according to claim 1, wherein manufacturing the substrate comprises:

providing a base substrate;

forming a gate metal layer on the base substrate;

forming a pattern including a gate electrode through a patterning process; and forming a gate insulation layer on the gate electrode.

5. A method of manufacturing an array substrate, comprising:

forming a thin film transistor through the method according to claim 4.

6. A method of manufacturing an array substrate, comprising:

forming a thin film transistor by the method according to claim 1.

7. The method according to claim 6, wherein, before forming the source and drain metal layer, the method of manufacturing the array substrate further comprises:

forming a first pixel electrode such that a position of a portion of the first pixel electrode corresponds to a position of a portion of the drain electrode of the thin film transistor which is to be formed later; and annealing the first pixel electrode.

8. The method according to claim 7, wherein the first pixel electrode is a plate-shaped electrode.

9. The method according to claim 7, wherein after forming the pattern including the source electrode and the drain electrode through a patterning process, the method of manufacturing the array substrate further comprises:

forming a passivation layer over the source electrode and the drain electrode;

forming a second pixel electrode on the passivation layer; and annealing the second pixel electrode.

10. The method according to claim 9, wherein the second pixel electrode is a slit electrode or a strip-shaped electrode.

11. The method according to claim 9, wherein after forming the passivation layer, the method of manufacturing the array substrate comprises:

annealing parts of the array substrate that have been formed.

12. The method according to claim 11, wherein during annealing the array substrate, a temperature for the annealing is 280° C., and a time period for the annealing ranges from 20 minutes to 40 minutes.

13. The method according to claim 9, wherein during annealing the second pixel electrode, an atmosphere for the annealing is air or nitrogen gas, a temperature for the annealing ranges from 230° C. to 280° C., and a time period for the annealing ranges from 20 minutes to 40 minutes.

14. The method according to claim 7, wherein during annealing the first pixel electrode, an atmosphere for the annealing is air or nitrogen gas, a temperature for the annealing ranges from 230° C. to 280° C., and a time period for the annealing ranges from 20 minutes to 40 minutes.

* * * * *